United States Patent
Dangler et al.

(10) Patent No.: US 8,863,046 B2
(45) Date of Patent: Oct. 14, 2014

(54) CONTROLLING IMPEDANCE AND THICKNESS VARIATIONS FOR MULTILAYER ELECTRONIC STRUCTURES

(75) Inventors: John Richard Dangler, Rochester, MN (US); Matthew Stephen Doyle, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1697 days.

(21) Appl. No.: 12/101,449

(22) Filed: Apr. 11, 2008

(65) Prior Publication Data
US 2009/0258194 A1 Oct. 15, 2009

(51) Int. Cl.
G06F 17/50 (2006.01)
H05K 1/00 (2006.01)
H05K 1/09 (2006.01)
H05K 1/02 (2006.01)
H05K 3/46 (2006.01)

(52) U.S. Cl.
CPC .............. *H05K 1/024* (2013.01); *H05K 3/4652* (2013.01); *H05K 2201/09881* (2013.01); *H05K 2201/0195* (2013.01); *H05K 2201/09236* (2013.01); *H05K 2201/0715* (2013.01)
USPC ............. 716/54; 716/100; 716/101; 716/132; 716/136; 716/137; 174/250; 174/251; 174/254

(58) Field of Classification Search
USPC ........ 716/1, 4, 5, 15; 174/250, 251, 254, 262, 174/264; 435/173.1, 4, 6
See application file for complete search history.

(56) References Cited

U.S. PATENT DOCUMENTS

| | | | | |
|---|---|---|---|---|
| 5,262,590 A | * | 11/1993 | Lia | 174/36 |
| 5,369,219 A | * | 11/1994 | Kerns | 174/250 |
| 5,480,841 A | * | 1/1996 | Bickford et al. | 29/827 |
| 5,640,699 A | * | 6/1997 | Ralph | 455/326 |
| 5,719,749 A | * | 2/1998 | Stopperan | 361/769 |
| 6,111,756 A | * | 8/2000 | Moresco | 361/735 |
| 6,205,654 B1 | | 3/2001 | Burns | |
| 6,395,480 B1 | * | 5/2002 | Hefti | 435/6 |
| 6,555,745 B1 | * | 4/2003 | Kruse et al. | 174/394 |
| 6,788,073 B2 | | 9/2004 | Wallace et al. | |
| 6,800,169 B2 | * | 10/2004 | Liu et al. | 156/292 |
| 6,847,853 B1 | | 1/2005 | Vinciarelli et al. | |
| 7,192,752 B2 | * | 3/2007 | Xu et al. | 435/173.1 |
| 7,236,060 B2 | | 6/2007 | Wood | |
| 7,239,013 B2 | * | 7/2007 | Shimada et al. | 257/691 |
| 7,249,337 B2 | * | 7/2007 | Gisin et al. | 716/15 |
| 7,276,986 B2 | | 10/2007 | Barr et al. | |

(Continued)

OTHER PUBLICATIONS

Goto et al., "Electrical Design Optimization and Characterization in Cell Broadband Engine Package," Publication Year 2006, Electronic Components and Technology Conference 2006, Proceedings, 56th.

(Continued)

*Primary Examiner* — Helen Rossoshek
(74) *Attorney, Agent, or Firm* — Matthew C. Zehrer

(57) ABSTRACT

Impedance control, and the uniformity of electrical and mechanical characteristics in electronic packaging are becoming more important as chip and bus speeds increase and manufacturing processes evolve. Current state of the art design and manufacture processes inherently introduce physical dielectric thickness variations into PCB cross sections. These thickness variations between the ground reference plane(s) and the signal layer(s) inject undesirable characteristic impedance variations and undesirable mechanical variations in thickness and surface topology. Therefore a multilayer electronic structure and a method of manufacture is presented.

16 Claims, 9 Drawing Sheets

(56) References Cited

U.S. PATENT DOCUMENTS

| | | | |
|---|---|---|---|
| 7,439,449 B1* | 10/2008 | Kumar et al. | 174/254 |
| 7,524,194 B2* | 4/2009 | Eldridge et al. | 439/66 |
| 7,531,751 B2* | 5/2009 | Hosomi et al. | 174/250 |
| 7,589,283 B2* | 9/2009 | Danoski et al. | 174/260 |
| 7,592,250 B2* | 9/2009 | Shimada et al. | 438/624 |
| 7,626,216 B2* | 12/2009 | McKinzie | 257/192 |
| 7,678,585 B2 | 3/2010 | Zimmer | |
| 7,696,442 B2* | 4/2010 | Muramatsu et al. | 174/260 |
| 7,703,201 B2* | 4/2010 | Oggioni et al. | 29/846 |
| 2003/0188890 A1 | 10/2003 | Bhatt et al. | |
| 2006/0121446 A1* | 6/2006 | Abassi et al. | 435/4 |
| 2006/0234405 A1 | 10/2006 | Best | |
| 2007/0039171 A1* | 2/2007 | Goergen | 29/825 |
| 2007/0066126 A1* | 3/2007 | Dutta et al. | 439/493 |
| 2008/0034335 A1 | 2/2008 | Cheng et al. | |
| 2008/0260985 A1 | 10/2008 | Shirai et al. | |
| 2009/0015858 A1 | 1/2009 | Saka et al. | |
| 2009/0032285 A1 | 2/2009 | Ueda et al. | |
| 2009/0107710 A1* | 4/2009 | Goergen | 174/258 |
| 2009/0118408 A1* | 5/2009 | Cox et al. | 524/403 |
| 2009/0158581 A1 | 6/2009 | Nguyen et al. | |
| 2009/0223710 A1* | 9/2009 | Becker et al. | 174/264 |
| 2009/0255713 A1* | 10/2009 | Dangler et al. | 174/250 |
| 2009/0255715 A1* | 10/2009 | Dangler et al. | 174/251 |
| 2009/0258194 A1 | 10/2009 | Dangler et al. | |
| 2009/0290476 A1 | 11/2009 | Okada | |
| 2010/0180437 A1* | 7/2010 | McKinzie | 29/825 |

OTHER PUBLICATIONS

Swirbel et al., "Electrical Design and Simulation of High Density Printed Circuit Boards," Publication Year 1999, Advanced Packaging, IEEE Transactions, vol. 22, Issue 3, pp. 416-423.

* cited by examiner

US 8,863,046 B2

CONTROLLING IMPEDANCE AND THICKNESS VARIATIONS FOR MULTILAYER ELECTRONIC STRUCTURES

CROSS REFERENCE TO RELATED APPLICATIONS

The present application is related to the following U.S. Patent Applications, which are hereby incorporated by reference herein in their entirety:

United States patent application Ser. No. 12/101,441, filed herewith titled "Controlling Impedance and Thickness Variations for Multilayer Electronic Structures".

United States patent application Ser. No. 12/101,455, filed herewith titled "Controlling Impedance and Thickness Variations for Multilayer Electronic Structures".

BACKGROUND

FIGS. 1A-1C illustrate the current state of the art in developing at least one type of multilayer electronic structure. A core consists of at least one layer of copper, a layer of bonding film (e.g., FR4, etc.), and a second layer of copper. Selected locations of the second layer of copper are removed (e.g., etched), leaving intact copper signal traces that provide for the internal circuitry of the electronic structure. Bonding film is laminated between a first core and a second core to provide a continuous multilayer electronic structure. When signal trace density changes (i.e., in a first location on the core there are numerous signal traces, and in a second location there are very few, if any, signal traces,) the distance from the signal traces to the reference ground layer varies across the PCB. This variation of distance results in variations in mechanical thickness, impedance, and electrical performance of the multilayer electronic structure.

For example see FIG. 1A. FIG. 1A depicts a prior art multilayer electronic structure having a single isolated signal trace. For instance if the signal trace is 4 mils wide, 0.7 mils thick, and the bonding film is 4 mils thick, after lamination the distance from the top of the signal trace to the adjacent reference ground layer approaches 3.3 mils.

Alternatively see FIG. 1B. FIG. 1B depicts a prior art multilayer electronic structure having a signal trace nestled between two wide traces (e.g., power signal trace, ground signal trace, etc.). For instance if the signal trace is 4 mils wide, 0.7 mils thick, and the bonding film is 4 mils thick, after lamination the distance from the top of the signal trace to the adjacent reference ground layer approaches 4.0 mils.

Alternatively see FIG. 1C. FIG. 1C depicts a prior art multilayer electronic structure having a single trace nestled between two other signal traces. For instance if each signal trace is 4 mils wide, 0.7 mils thick, and the bonding film is 4 mils thick, after lamination the distance from the top of the signal traces to the adjacent reference ground layer approaches 3.65 mils.

In the examples depicted in FIGS. 1A, 1B, and 1C, the distance from the top of the signal traces to the adjacent reference ground layer by itself leads to impedance differences of 48-51-53 Ohms respectively.

In the current state of the art, impedance and mechanical (i.e., thickness) tolerance requirements are tight and may become tighter. Currently impedance tolerances of +/−10% are typical (e.g., 50 Ohms +/−5 Ohms). In the future, impedance tolerances of +/−7.5% or 5.0% may become more common. In the examples depicted in FIGS. 1A, 1B, and 1C, 50% of the +/−10.0% tolerance is taken up by the effect of the distance variations from the top of the signal trace to the adjacent reference ground layer.

SUMMARY

The present invention generally relates to multilayer electronic structures (i.e., printed circuit board (PCB), microstrip, coplanar PCB, stripline, etc., or any such equivalent multilayer electronic structures) and method(s) relating to the multilayer electronic structures.

Herein multilayer electronic structures may be referred to generally as electronic structures. In other words, the terms multilayer electronic structure, electronic structure, PCB, microstrip, etc. may be used interchangeably.

Impedance control, and the uniformity of electrical and mechanical characteristics in electronic packaging are becoming more important as chip and bus speeds increase and manufacturing processes evolve. Current state of the art design and manufacture processes inherently introduce physical dielectric thickness variations into PCB cross sections. These thickness variations between the ground reference plane(s) and the signal layer(s) inject undesirable characteristic impedance variations and undesirable mechanical variations in thickness and surface topology.

In an embodiment of the present invention characteristic impedance variations due to non uniformity in both signal density and dielectric bonding film thickness are improved. In other words, the cross section thickness across the entire electronic multilayer electronic structure is more uniform.

In another embodiment a method of multilayer electronic structure manufacture comprises providing a core layer with at least one signal trace thereupon; applying characterized fill to the core, adjacent to the at least one signal trace, and; laminating a dielectric layer to the core. In another embodiment the volume of characterized fill is approximately equal to the volume of signal trace material that is removed in the signal trace creation process.

In another embodiment the method of multilayer electronic structure manufacture further comprises determining an optimum impedance and adjusting the amount of characterized fill to be added based on the optimum impedance. In another embodiment the method of multilayer electronic structure manufacture further comprises determining an optimum via size or via density and adjusting the amount of characterized fill to be added based on the optimum via size or via density. In this embodiment the via size or via density relates to a via(s) electrically formed/connected to a signal trace.

In another embodiment a multilayer electronic structure comprises a dielectric layer, a core layer having at least a first location with at least one signal trace thereupon, and a second location with no signal traces thereupon, and a characterized fill layer applied upon the second location. In another embodiment the amount of characterized fill applied is inversely proportional to the volume of the at least one signal trace. In another embodiment the amount of characterized fill applied is approximately equal to a volume equal to the area of the second group multiplied by the height of the at least one signal trace. In another embodiment the amount of characterized fill applied is based on an optimum impedance. In another embodiment the optimum impedance at least in part relates to via geometry.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Figure 2A:
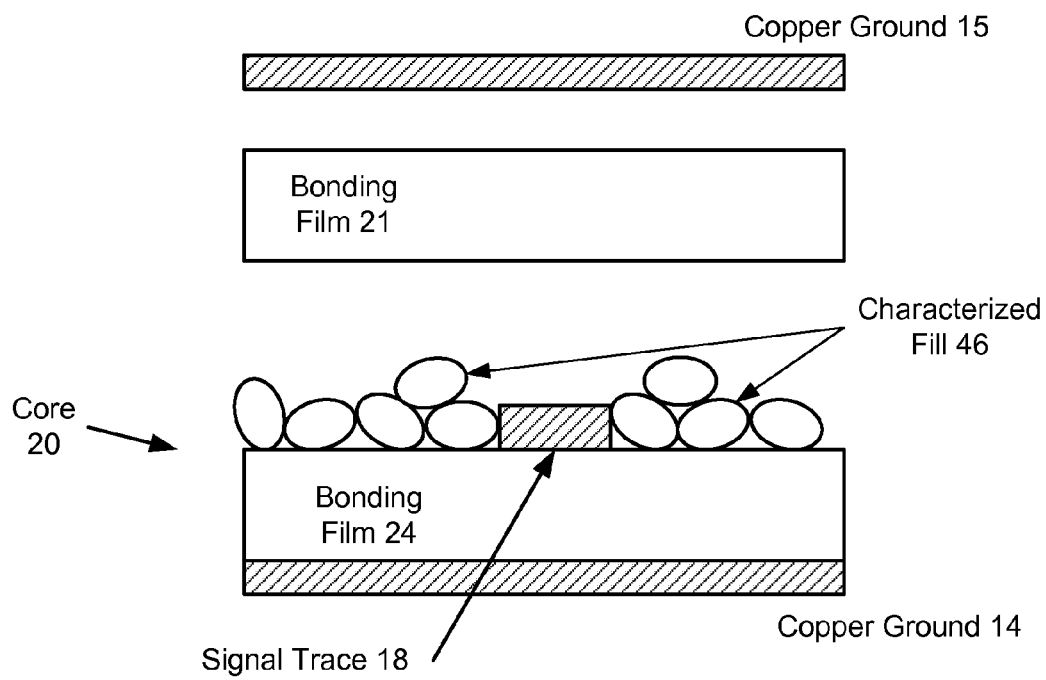
FIG. 2A depicts an exploded view of the components of a multilayer electronic structure, utilizing characterized fill, according to an embodiment of the present invention.

Referring to the drawings, wherein like numbers denote like parts throughout the several views. Please refer to FIG. 2A. FIG. 2A depicts an exploded view of the components of a multilayer electronic structure, utilizing characterized fill 46, according to an embodiment of the present invention. The multilayer electronic structure comprises a first layer (e.g., core 20, etc.), a second layer (e.g., copper ground 15, etc.), and characterized fill layer 46 utilized to bond the first and second layers together. For example, characterized fill layer may bond two different core 20 layers together, or may bond a single core 20 layer with a copper ground 15 layer. Other layer types may be bonded together without deviation from the scope of the present invention. The copper ground 15 layer may itself be a layer, or may be the bottom of a second core 20. In certain embodiments additional characterized fill 46 is added so that the bonding film 21 layer may be removed or not utilized. In other words bonding film 21 is not necessary.

Core 20 comprises a copper ground 14 (may be used as a reference ground layer), a layer of bonding film 24 (e.g., FR4, etc.), and a second layer of copper. Selected locations of the second layer of copper are removed (e.g., etched), leaving intact copper signal traces that provide for the internal circuitry of the electronic structure. In the embodiment shown by FIG. 2A, the second layer of copper is etched leaving a signal trace 18.

In an alternate embodiment to produce a uniform distance from the top of the signal trace to the adjacent reference ground layer, utilizes a dispersal apparatus (e.g., printer, sputterer, etc.) to disperse upon core 20 characterized fill 46. Characterized fill 46 is dielectric material similar to bonding film 21 and/or 24. In certain embodiments characterized fill 46 may be partially cured epoxy. Characterized fill 46 is dispersed in locations effectively normalizing the distance variation from the top of bonding film 24 to the plane coincident to the top of signal trace 18.

In a particular embodiment, characterized fill 46 is made from the same material as bonding film 21 and/or 24, thus minimizing variations. In certain embodiments, characterized fill may be dispersed thermally, wherein small amounts of epoxy material are dispersed upon core 20 and thereby adhere to core 20. In this embodiment, the characterized fill may be cured/reflowed with the standard lamination process after dispersal.

In another embodiment, the dispersal pattern is 'inverse' of the density of the signal traces upon the core. As the density of signal traces increase, the amount of characterized fill 46 dispersed upon core 20 decreases. In certain embodiments, no characterized fill is dispersed in the highest dense signal trace location upon core 20. In certain other embodiments, the amount of characterized film 46 dispersed is approximately equal to the amount (by volume, etc.) of copper that was etched away (thereby leaving the various signal traces).

Figure 3A:
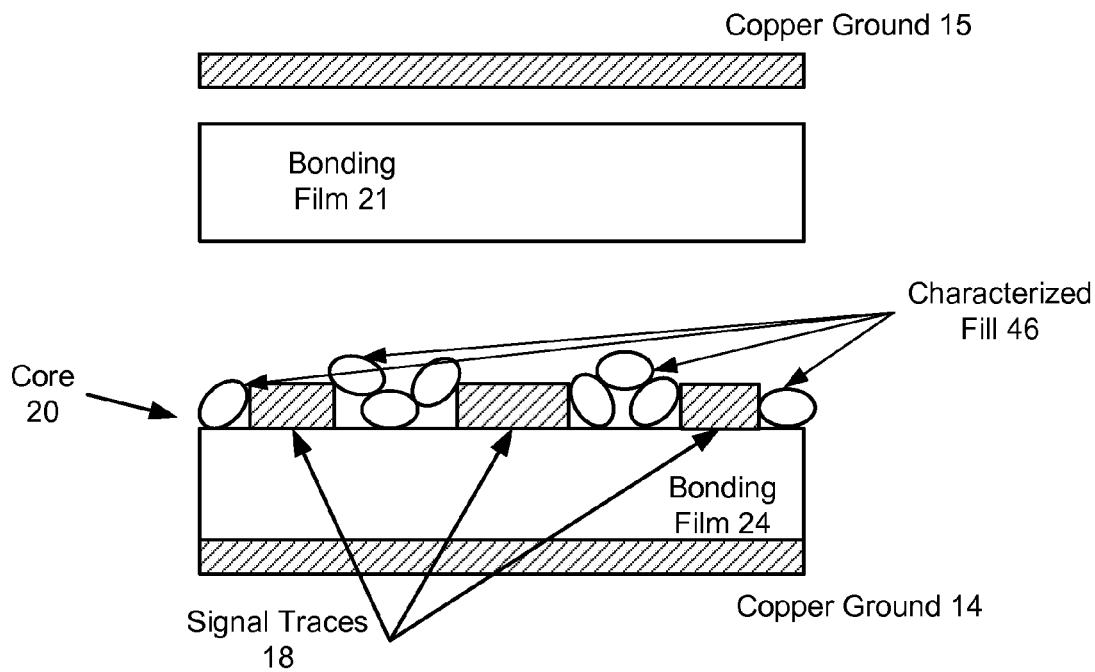
FIG. 3A depicts an exploded view of the components of a multilayer electronic structure, utilizing characterized fill, according to an embodiment of the present invention.
Figure 3B:
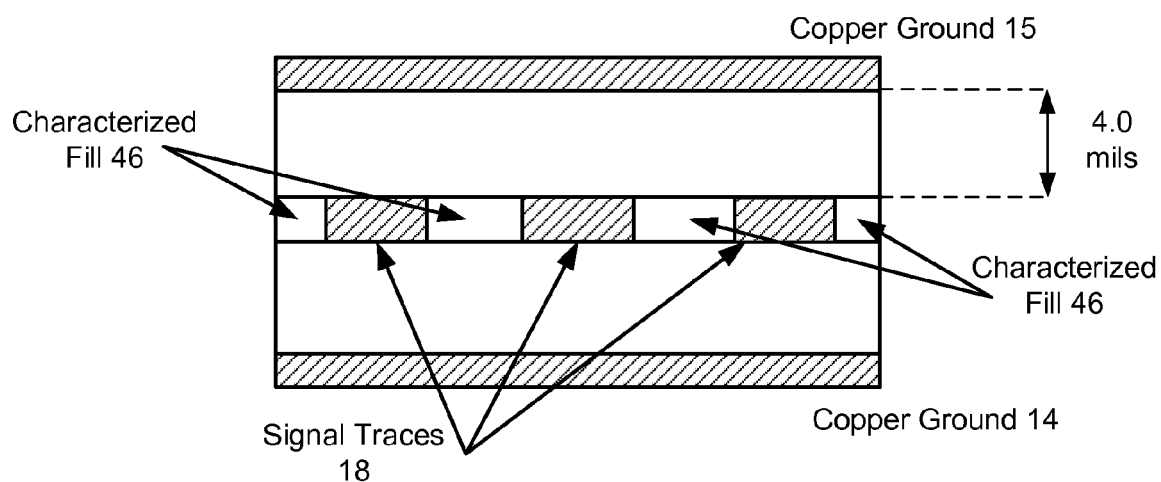
FIG. 3B depicts the multilayer electronic structure of FIG. 3A according to an embodiment of the present invention.
Figure 3C:
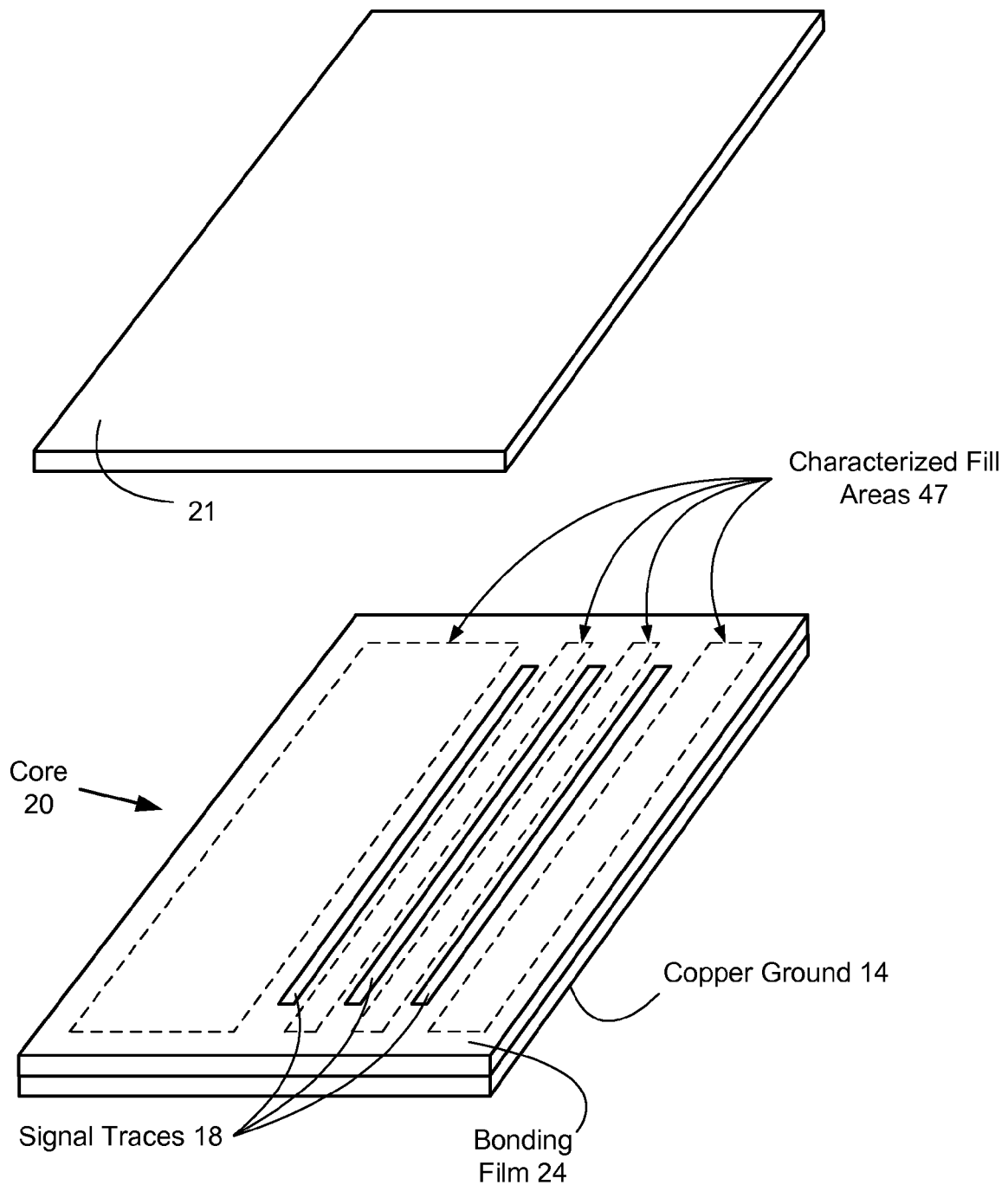
FIG. 3C depicts an isometric exploded view of various layers of a particular multilayer electronic structure.

In certain other embodiments, as shown in FIG. 3C, characterized fill 46 is only dispersed in characterized fill areas 47. Characterized fill areas 47 are locations upon core 20 that have a low density of signal traces. In another embodiment, characterized fill areas 47 are locations upon core 20 not having signal traces.

The amount and location of the characterized fill 46 dispersal depends on the density and location of the various signal traces 18 on core 20. The less signal traces upon core 20, the more characterized fill 46. In certain embodiments the volume of characterized fill 46 is approximately equal to the volume of removed copper (the remaining copper being the various signal traces).

By utilizing characterized fill 46, a designer may calculate a desired distance between the top of a signal trace to the adjacent reference ground layer or a desired impedance. Via size and/or signal trace density may be determined in order to provide the desired distance and/or impedance. The designer may adjust the amount and location of dispersed characterized fill 46, to achieve the desired distance/impedance.

Figure 1A:
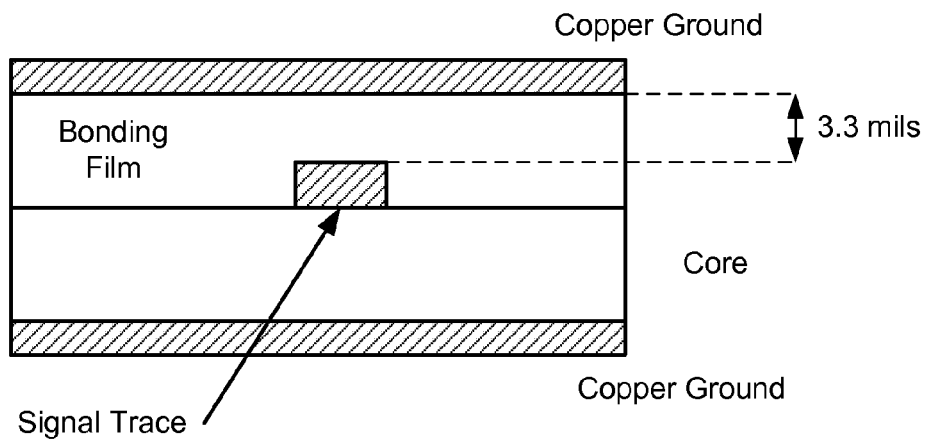
FIG. 1A depicts a prior art multilayer electronic structure section having a single isolated signal trace.
Figure 1B:
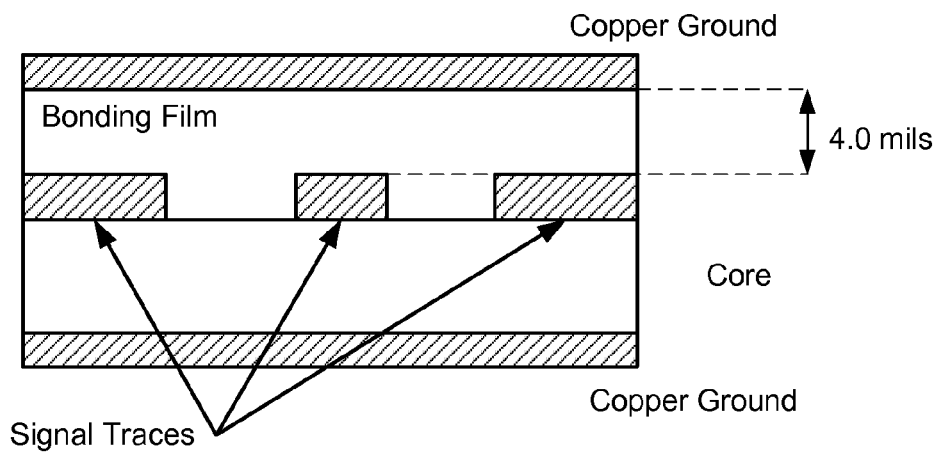
FIG. 1B depicts a prior art multilayer electronic structure section having a signal trace nestled between two wide signal traces.
Figure 2B:
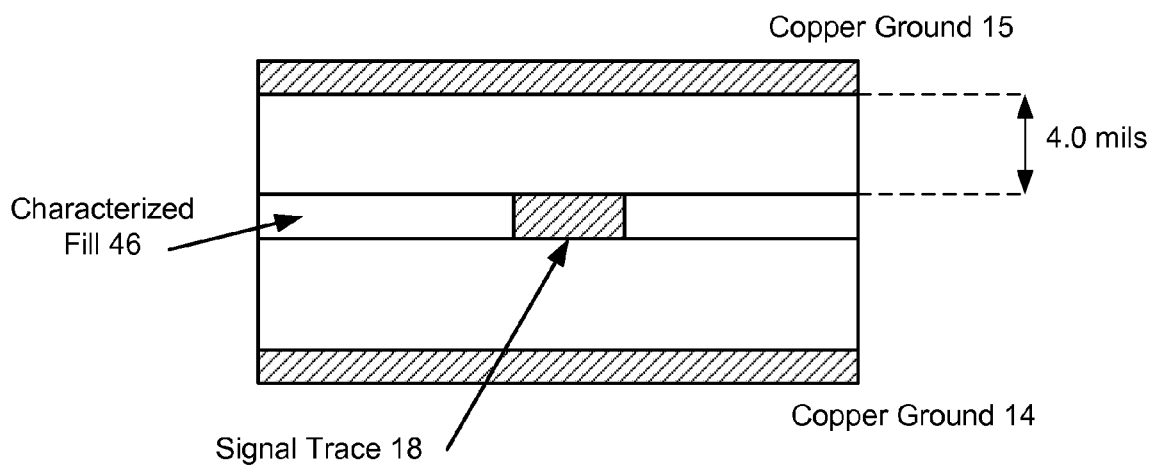
FIG. 2B depicts the multilayer electronic structure of FIG. 2A according to an embodiment of the present invention.

Please refer to FIG. 2B. FIG. 2B depicts the multilayer electronic structure of FIG. 2A after lamination, according to an embodiment of the present invention. By utilizing characterized film 46, the effect of the distance variations from the top of signal trace 18 to the adjacent reference ground layer (i.e., copper ground 15, etc.) is greatly reduced, if not eliminated. Please refer back to FIG. 1A, wherein a similar core configuration resulted in a distance (the distance from the top of the signal trace to the adjacent reference ground layer) of 3.3 mils as compared to a distance of 4.0 mils when utilizing the characterized fill 46.

Please refer to FIG. 3A. FIG. 3A depicts an exploded multilayer electronic structure, according to an embodiment of the present invention. The exploded multilayer electronic structure comprises a first layer, a second layer, characterized fill 46 utilized to bond the first and second layers together. Characterized fill 46 may dispersed, as described above, in the spaces not filled by signal traces.

Figure 1C:
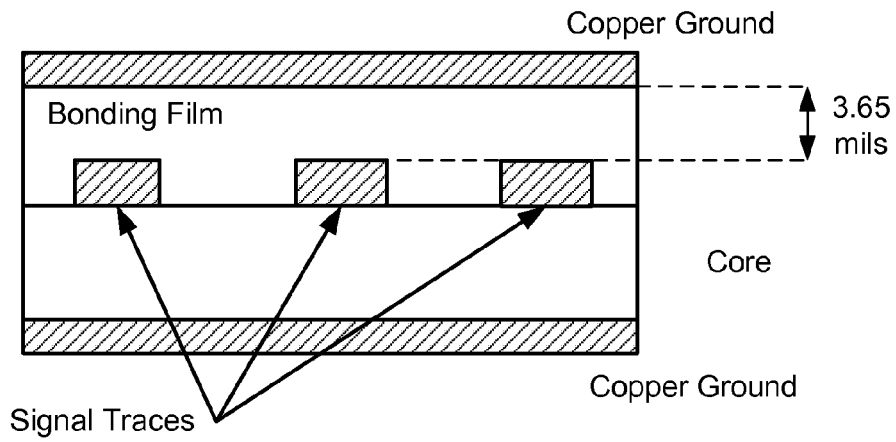
FIG. 1C depicts a prior art multilayer electronic structure section having a single trace nestled between two other signal traces.

FIG. 3B depicts the multilayer electronic structure of FIG. 3A after lamination, according to an embodiment of the present invention. By utilizing characterized fill 46, the effect of the distance variations from the top of signal trace 18 to the adjacent reference ground layer (i.e., copper ground 15) is greatly reduced, if not eliminated. Please refer back to FIG. 1C, wherein the similar core configuration resulted in a distance (the distance from the top of the signal trace to the adjacent reference ground layer) of 3.65 mils as compared to a distance of 4.0 mils when utilizing the characterized fill 46.

By utilizing characterized fill 46 a constant distance from the top of the signal trace to the adjacent reference ground layer occurs in multiple signal trace configurations. This constant distance reduces the impedance tolerance across the multilayer circuit board.

Figure 4:
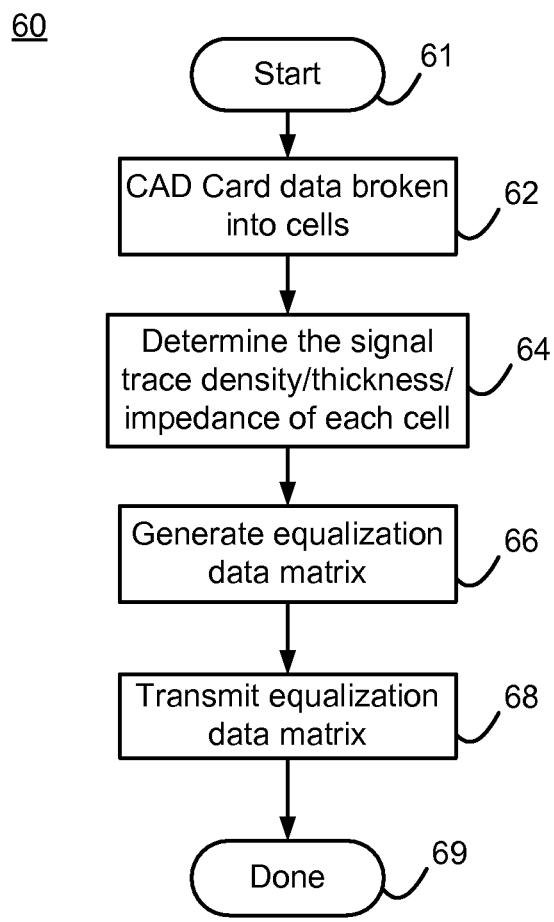
FIG. 4 depicts a process of generating equalization data used to equalize thickness and/or impedance tolerances in multilayer printed circuit cards, according to an embodiment of the present invention.

Please refer to FIG. 4. FIG. 4 depicts a process 60 of generating equalization data utilized to equalize thickness and/or impedance variations across a multilayer printed circuit card, according to an embodiment of the present invention. Process 60 begins at block 61. In order to determine the geometrical and manufacturing properties (quantity, location, etc.) of characterized fill 46, and/or alternatively characterized bonding film 22, equalization data is created. Equalization data is utilized to equalize thickness and/or impedance variations across a multilayer printed circuit card. Equalization data represents the data data associated with characterized fill 46 (i.e., the locations of where to disperse, etc). An equalization data matrix is the equalization data of at least two locations of the multilayer printed circuit card. In an alternative embodiment, the equalization data matrix is the equalization data of the entire multilayer printed circuit card. Creating equalization data may be dependent on determining the signal trace density of a particular area (block 64) of the circuit card. In other embodiments, discussed infra, equalization data may be dependent on determining circuit board layer(s) thickness/impedance (block 64). The particular location of the printed circuit card considered is referred to as a cell. The cell may be a two dimensional area or a three dimensional volume. The area/volume of the cell is adjustable, however the smaller the area/volume of a cell, better equalization data may be created. When a generation of cells (block 62) in/from/to the computer aided design (CAD) data of the multilayer printed circuit card occurs, equalization data may be created for each cell. When there is more than one cell, the equalization data matrix is created (block 66). Once generated, the equalization data, or equalization data matrix, may be transferred (block 68), for example to a card manufacturer. Process 60 ends at block 69.

Figure 5A:
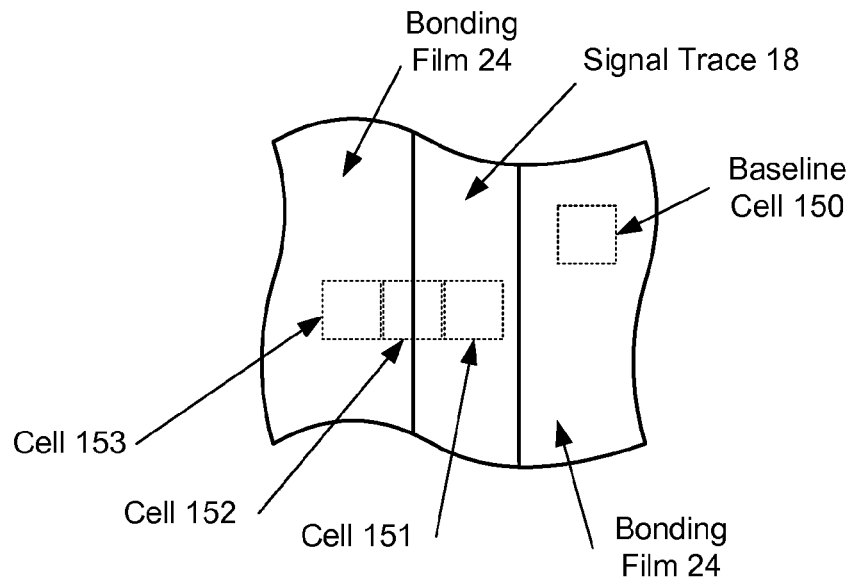
FIG. 5A depicts a top view of a section of a multilayer electronic structure having a signal trace thereupon wherein cells are utilized to determine the signal trace density.
Figure 6:
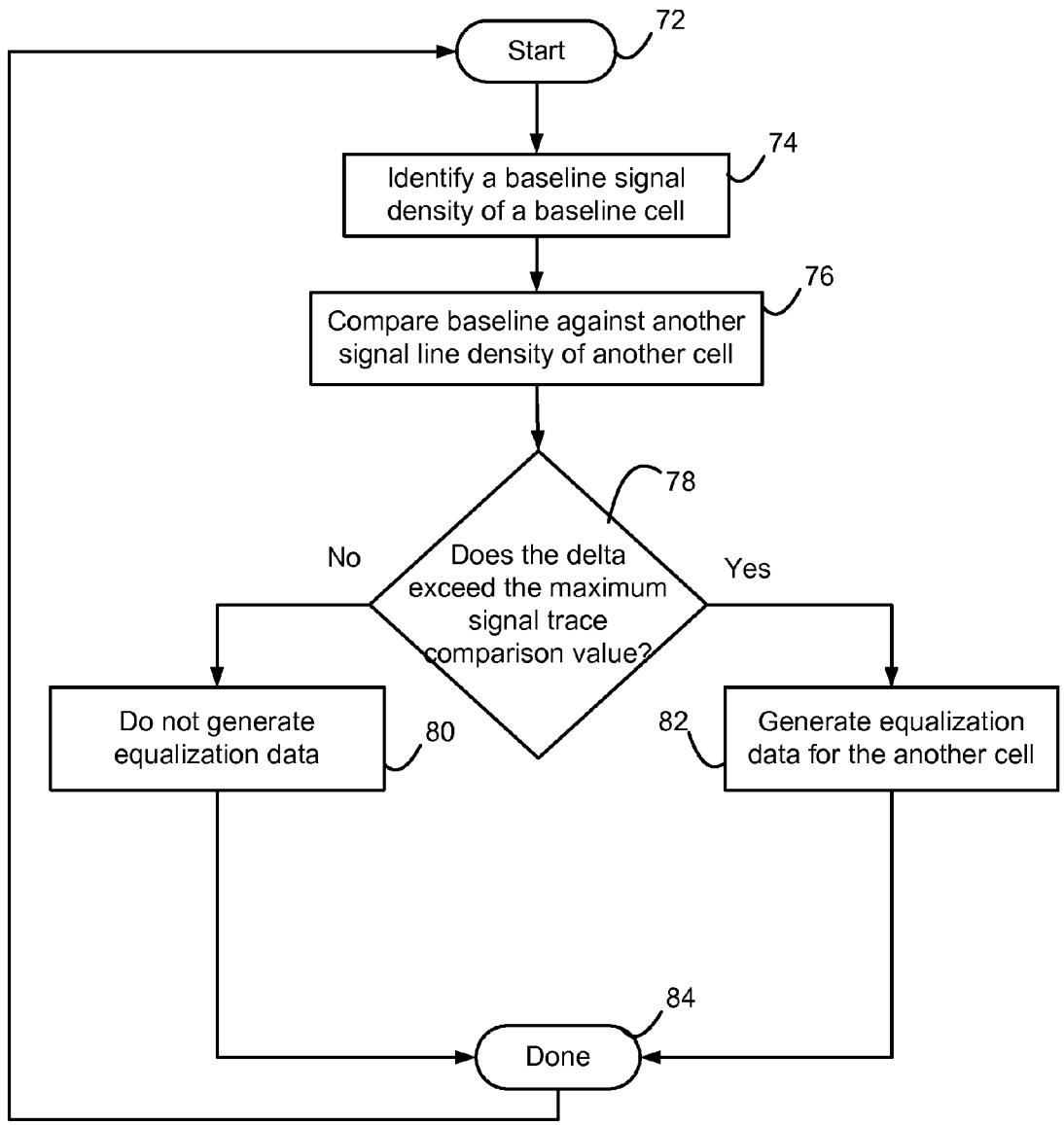
FIG. 6 depicts a process of generating equalization data utilizing the signal trace density of particular layers of multilayer printed circuit card, according to an embodiment of the present invention.

Please refer to FIG. 5A and FIG. 6 concurrently. FIG. 5A depicts a top view of a multilayer electronic structure layer having a signal trace thereupon, further depicting a baseline cell 150, and cells 151-153. FIG. 6 depicts another process 70 of determining the signal trace density of each cell and the generating equalization data, according to an embodiment of the present invention. Process 70 starts at block 72. Upon generating of cells in/from/to the CAD data (block 62 shown in FIG. 4), a baseline cell 150 is identified (block 74). The baseline cell 150 has a corresponding baseline signal trace density (for instance the percentage of the cell filled by the signal traces). In a particular embodiment, shown in FIG. 5A, the baseline cell 150 is a cell having no signal trace(s) within. In another embodiment, the baseline cell is completely filled by a signal trace. In other embodiments the baseline cell may have any percentage of the cell encapsulating a signal trace, however it is preferable that the baseline entirely encapsulates a signal trace, or does not encapsulate any signal trace. The base line cell 150 (and/or baseline cell signal trace density) is compared to another cell (and/or another cell signal trace density) (block 76). If the delta exceeds the maximum signal trace comparison value, equalization data is generated for the another cell (block 82). Take for example, FIG. 5A. The baseline cell 150 encapsulates no signal trace(s), cell 153 also encapsulates no signal trace(s), cell 152 is 50% filled by a signal trace and 50% not filled by a signal trace, and finally cell 151 entirely encapsulates a signal trace(s). A preset maximum comparison signal trace density value (block 78) is set, for example at 0.10, meaning that equalization data is generated for the another cell if the another cell has a signal trace density of greater than 10% of the baseline cell. The maximum preset comparison signal trace density value may be adjustable by a user. Cell 152 (50% filled, 50% not filled) has a signal trace density of 0.5 because it is half filled by a signal trace. Cell 153 has a signal trace density of 0.0 because it does not encapsulate a signal trace. Cell 151 has a signal trace density of 1.0 because it does entirely encapsulate a signal trace. Because 1.0 and 0.5, respectively exceeds the maximum comparison signal trace density value of 0.1, equalization data is generated for cell 152 and 151 (block 82). If however the actual signal trace density value does not exceed the preset maximum signal trace density value of 0.1, such as cell 153's value of 0.0, equalization data is not generated for cell 153 (block 80). In another embodiment equalization data is generated for cell 153 indicating that no characterization shall occur in the location of the characterized bonding film in the corresponding location. Process 70 ends at block 84.

In another embodiment equalization data is generated for use relating to characterized fill 46 utilizing the cell structure exemplified in FIG. 5A. In this particular embodiment the equalization data indicates the locations and quantity of characterized fill to be added upon core 20. Please continue the example from above (i.e., baseline cell 150 encapsulates no signal trace(s), cell 153 also encapsulates no signal trace(s), cell 152 is 50% filled by a signal trace and 50% not filled by a signal trace, and finally cell 152 entirely encapsulates a signal trace(s)). Signal trace properties are determined or are known (i.e., height and width, etc.). The area of each cell is known or is determined. Each cell is analyzed whereby it is determined that 50% of the cell 152 is filled by a signal trace(s). Assume each cell's area is 0.5 mil square, and the thickness of the signal trace 18 is 1.4 mils. Therefore, 0.25 mil square of cell 152 is filled by the signal trace 18, (50% of the cell area). Thus, 0.25 mil square×the signal trace 18 height (1.4 mils)=0.35 cubic mils. This volume therefore is the approximate volume of characterized fill 46 that is added upon core 20 in the particular location that corresponds with cell 152. No characterized fill 46 would be added upon core 20 in the location corresponding to cell 151. 0.7 cubic mills (0.5 square mills*1.4 mills) is the approximate volume of characterized fill 46 that would be added upon core 20 in the location corresponding cell 153.

The geometry of the characterized fill 46 may be any such geometry without departing from the scope of the present invention.

Figure 5B:
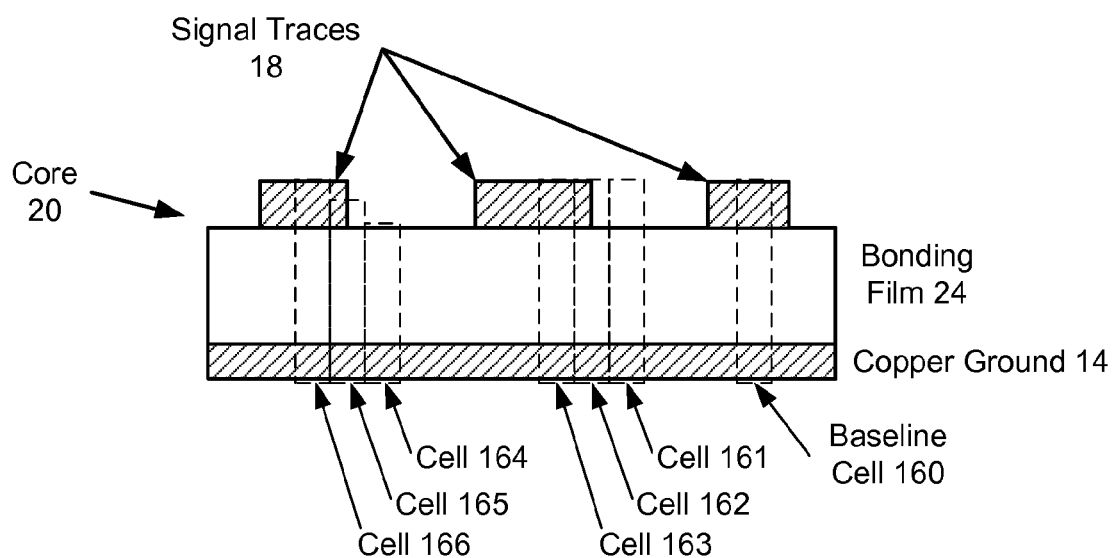
FIG. 5B depicts a side view a section of a multilayer electronic structure having three signal traces thereupon wherein cells are utilized to determine thickness and/or impedance.
Figure 7:
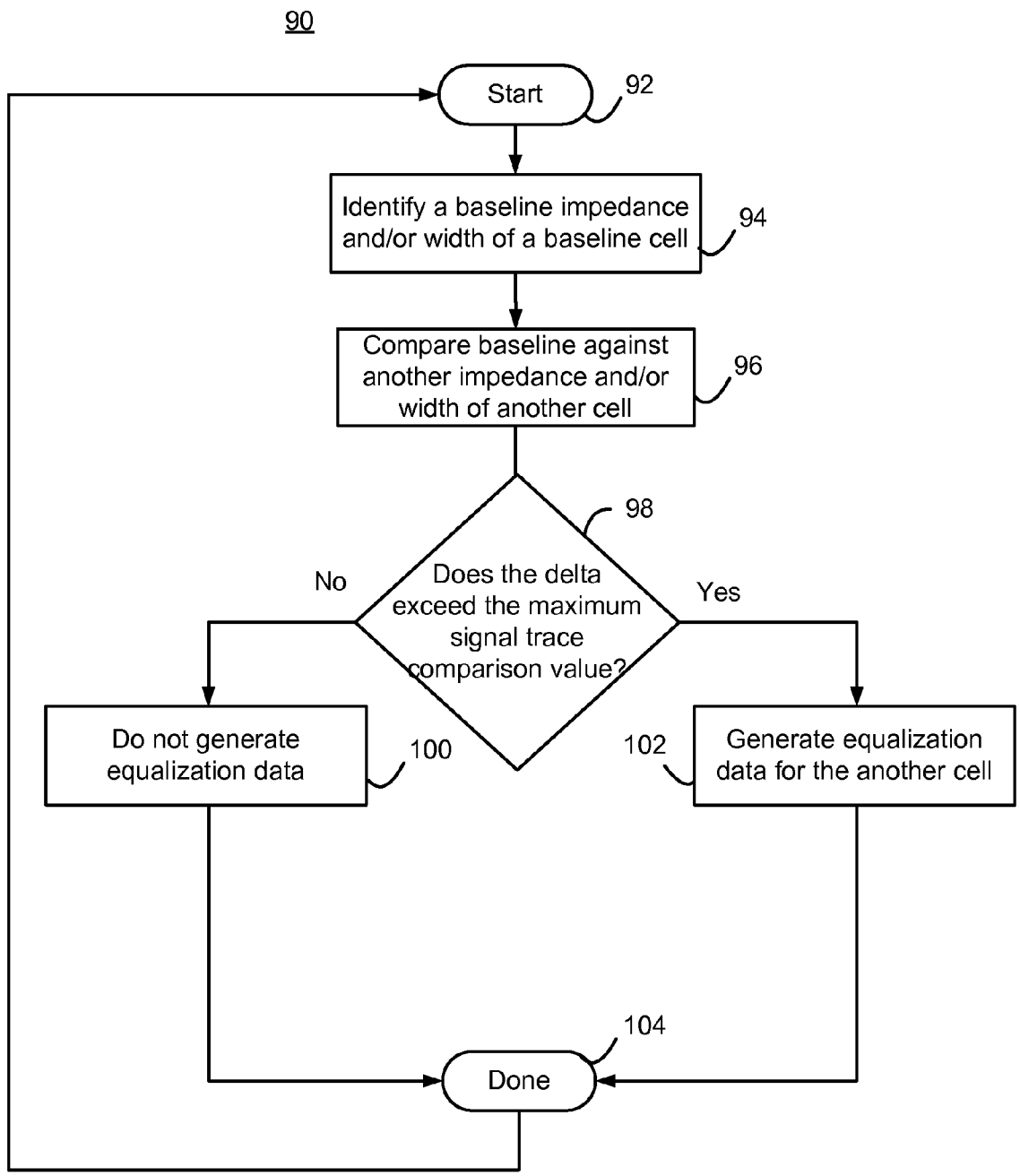
FIG. 7 depicts a process of generating equalization data utilizing the thickness/impedance of a particular layer(s) of a multilayer printed circuit card, according to an embodiment of the present invention.

Please refer to FIG. 5B and FIG. 7 concurrently. FIG. 5B depicts a side view of a multilayer electronic structure core 20 having signal traces 18 thereupon, further depicting baseline cell 160, and cells 161-163. FIG. 7 depicts yet another alternative process of determining the signal trace impedance/width of each cell and generating equalization data, according to an embodiment of the present invention. Process 90 starts at block 92. Upon generating cells in/from/to the CAD data (block 62, shown in FIG. 4), a baseline cell 160 is identified (block 94). The cells (baseline and others), as contemplated in utilizing process 90, are three dimensional volumes. The baseline cell 160 encapsulates a section of the at least one CAD circuit card layer. Therefore the baseline cell 160 has a particular first dimension, second dimension, and a third dimension that corresponds to the thickness of the at least one CAD circuit card layer. In a particular embodiment, the baseline cell is a cell encapsulating a section of core 20 and no signal trace(s) (not shown). In another embodiment the base line cell 160 encapsulates a section of core 20 and a signal trace (as shown in FIG. 5B). It may be preferred to create the baseline cell 160 such that the cell has the largest volume possible without empty space above and below the particular circuit board layer(s). In another embodiment the other cell (i.e., cells 161-163) volume equals the volume of baseline cell 160. In other embodiments the volumes of the other cells do not equal the volume of the baseline cell. Further, the volume of cell 161 for instance, may not equal the volume of cell 162. For example because there is empty space in cell 161, cell 161 may be shortened such that the height would be similar to the height of the copper ground 14 and bonding film 24 stack. In another embodiment in an instance where there is empty space in a cell (i.e., cell 161 and 162) the height of those cells are shortened by a distance similar to the distance of the signal trace 18 height.

Baseline cell 160 has a baseline thickness/impedance. The baseline cell 160 thickness/impedance is compared to another cell's (cell 161-163) thickness/impedance (block 96). If the resultant of the comparison indicates that the delta exceeds the maximum signal trace comparison value (block 98), equalization data is generated for the another cell (block 102). In a new example, the baseline cell 160 encapsulates the at least one layer of a printed circuit card (e.g., copper ground 14 and bonding film 24) and at least part of a signal trace 18. In the present embodiment, as shown in FIG. 5B, the dimension of cells 161-163 are set similarly to the dimensions of the baseline cell 160, however as indicated above the volumes of each cell need not be similar. Cell 163 similarly encapsulates the at least one layer of a printed circuit card and at least part of a signal trace 18. Cell 162 encapsulates the at least one layer of a printed circuit card and at least part of a signal trace 18, but also encapsulates empty space (i.e., space without a section of signal trace 18). Cell 161 encapsulates the at least one layer of a printed circuit card and does not encapsulate at least part of a signal trace 18 (i.e., cell 161 has more empty space than 162). Thus cells 161-163 demonstrate the transition from a location of a electronic structure layer going from at least one layer without a signal trace there upon (cell 161), to a location where part of the cell encapsulates a signal trace and part of the cell does not (cell 162), to a location of a layer with a signal trace there upon (cell 163).

A preset maximum comparison impedance/thickness value (block 98) is generated, meaning that equalization data is generated (block 102) for the another cell if the another cell has thickness/impedance greater than the baseline cell. The maximum preset comparison value may be adjustable. If however the actual impedance/thickness value does not exceed the preset maximum comparison value, equalization data is not generated for the another cell (block 100). Process 90 ends at block 104.

In another embodiment equalization data is generated for use relating to characterized fill 46, utilizing the cell structure exemplified in FIG. 5B. In this particular embodiment the equalization data indicates the locations and quantity of characterized fill to be added upon core 20. For example cell 164 is compared with cell 166. The volume differential of cell 166 and 164 would represent the equalization data for cell 164. The impedance/height of the cells may also be translated into a volume. This volume differential would be the volume of material that is to be added upon core 20 in the location that corresponds to cell 164. For example cell 164 is compared with cell 166. The volume differential of cell 166 and 164 would represent the equalization data for cell 166. The impedance/height of the cells may also be translated into a volume. This volume differential would be for instance the volume of characterized fill in the location that corresponds to cell 166.

Figure 8:
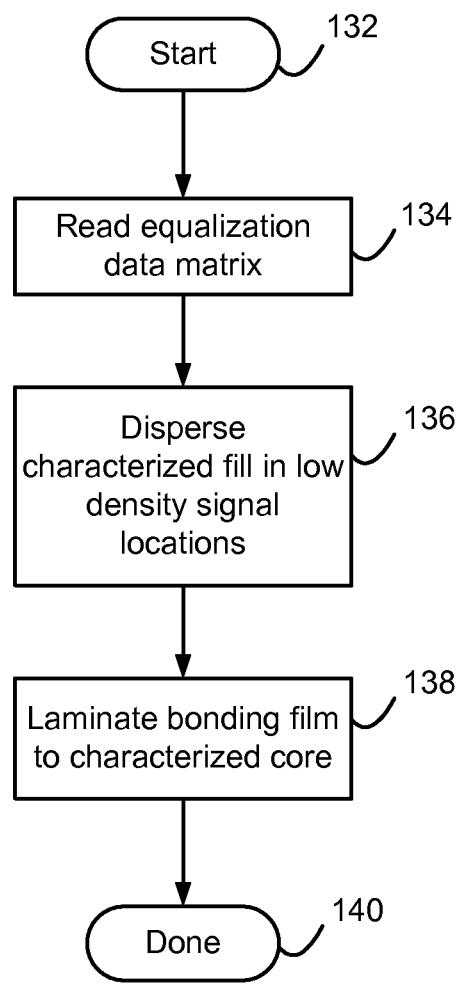
FIG. 8 depicts an alternative method of multilayer electronic structure manufacture according to an embodiment of the present invention.

FIG. 8 depicts a method of multilayer electronic structure manufacture according to an embodiment of the present invention. Method 130 begins at block 132 and may also be practiced, for example, by a card manufacturer. The equalization data matrix is read (block 134) to determine the particular areas upon core 20 that characterized fill 46 are to be added. Characterized fill is dispersed (block 136) upon core 20 in characterized fill areas 47. Bonding film is then laminated (block 138) to the characterized core (core 20 having characterized fill 46 thereupon). Method 130 ends at block 140.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The invention claimed is:

1. A method of multilayer electronic structure manufacture, comprising:
   providing a core with at least one signal trace thereupon;
   applying non-conductive characterized fill to the core, adjacent to the at least one signal trace; and
   laminating a dielectric layer to the core.

2. The method of claim 1, wherein the characterized fill is a dielectric material applied to one or more locations of the core not having signal traces thereupon.

3. The method of claim 2, wherein there are at least two signal traces upon the core layer, and wherein the characterized fill at least marginally fills the area between the two signal traces, and wherein the amount of characterized fill applied is such that upon lamination the height of the two signal traces and the height of the characterized fill is similar.

4. The method of claim 3, wherein the amount of characterized fill applied to the core is inversely proportional to the density of signal traces.

5. The method of claim 4, wherein the amount of characterized fill applied is approximately equal to the volume of signal trace material that is removed in the signal trace creation process.

6. The method of claim 5, further comprising:
   determining an optimum impedance for the multilayer electronic structure; and
   adjusting the amount of characterized fill to be applied based on the optimum impedance.

7. The method of claim 6, wherein the optimum impedance at least in part relates to signal trace density.

8. The method of claim 5, further comprising:
  determining an optimum thickness for the multilayer electronic structure; and
  adjusting the amount of characterized fill to be applied based on the optimum thickness.

9. The method of claim 8 wherein the optimum thickness at least in part relates to signal trace density.

10. The method of claim 9, wherein the optimum thickness at least in part relates to a printed circuit board thickness standard.

11. A multilayer electronic structure comprising:
  a core layer having at least a first location with at least one signal trace thereupon, and at least a second location with no signal traces thereupon; and
  a non-conductive characterized fill applied upon the core layer within the second location.

12. The multilayer electronic structure of claim 11, where there are at least two signal traces upon the core layer, and wherein the characterized fill at least marginally fills the area between the at two signal traces, and wherein the amount of characterized fill applied is such that upon lamination the height of the two signal traces and the height of the characterized fill is similar.

13. The multilayer electronic structure of claim 12, wherein the amount of characterized fill applied is inversely proportional to the volume of the at least one signal trace.

14. The multilayer electronic structure of claim 13, wherein the volume of characterized fill applied is approximately equal to a volume equal to the area between the at two signal traces multiplied by the height of the two signal traces.

15. The multilayer electronic structure of claim 14, wherein the amount of characterized fill applied is determined from a consideration of the relationship between the thickness of the multilayer electronic structure and an optimum impedance of the multilayer electronic structure.

16. The multilayer electronic structure of claim 15, wherein the optimum impedance at least in part relates to via size or via density.

\* \* \* \* \*